United States Patent
Buer et al.

(10) Patent No.: US 6,704,236 B2
(45) Date of Patent: Mar. 9, 2004

(54) METHOD AND APPARATUS FOR VERIFICATION OF A GATE OXIDE FUSE ELEMENT

(75) Inventors: Myron J. Buer, Gilbert, AZ (US); Douglas D. Smith, Mesa, AZ (US)

(73) Assignee: Broadcom Corporation, Irvine, CA (US)

( * ) Notice: Subject to any disclaimer, the term of this patent is extended or adjusted under 35 U.S.C. 154(b) by 17 days.

(21) Appl. No.: 10/038,021

(22) Filed: Jan. 3, 2002

(65) Prior Publication Data

US 2003/0123314 A1 Jul. 3, 2003

(51) Int. Cl.[7] .............................................. G11C 17/16
(52) U.S. Cl. ........................ 365/225.7; 365/96; 365/210
(58) Field of Search ............................... 365/225.7, 201, 365/96, 210

(56) References Cited

U.S. PATENT DOCUMENTS

| | | | |
|---|---|---|---|
| 5,319,592 A | 6/1994 | Nguyen | 365/96 |
| 5,384,746 A * | 1/1995 | Giolma | 365/225.7 |
| 5,387,823 A | 2/1995 | Ashizawa | 326/13 |
| 5,418,738 A | 5/1995 | Abadeer et al. | 365/100 |
| 5,886,392 A | 3/1999 | Schuegraf | 257/530 |
| 6,044,012 A | 3/2000 | Rao et al. | 365/182 |
| 6,055,205 A | 4/2000 | Rao et al. | 365/230.06 |
| 6,181,627 B1 | 1/2001 | Casper et al. | 365/225.7 |
| 6,185,705 B1 | 2/2001 | Cutter et al. | 714/721 |
| 6,292,422 B1 * | 9/2001 | Pitts | 365/225.7 |
| 6,522,582 B1 * | 2/2003 | Rao et al. | 365/185.08 |
| 6,611,040 B2 * | 8/2003 | Gelsomini et al. | 257/530 |
| 2003/0011379 A1 * | 1/2003 | Khoury | 324/529 |

* cited by examiner

*Primary Examiner*—Richard Elms
*Assistant Examiner*—J. H. Hur
(74) *Attorney, Agent, or Firm*—McAndrews, Held & Malloy, Ltd.

(57) ABSTRACT

A method and circuit for verifying the state of a gated fuse element used with a one-time programmable CMOS memory device. A first expected state is set and a state of a first gate-ox fuse is sensed. The state of the first gate-ox fuse is compared to the first expected state to determine if they are equal, and a first signal is generated. A second expected state is set and a state of a second gate-ox fuse is sensed. The state of the second gate-ox fuse is compared to the second expected state to determine if they are equal, and a second signal is generated. A valid output is generated if both the first and second signals are in a correct state, both signals are high for example.

5 Claims, 13 Drawing Sheets

METHOD AND APPARATUS FOR VERIFICATION OF A GATE OXIDE FUSE ELEMENT

CROSS REFERENCE TO RELATED APPLICATIONS

[Not Applicable]

FEDERALLY SPONSORED RESEARCH OR DEVELOPMENT

[Not Applicable]

SEQUANCE LISTING

[Not Applicable]

BACKGROUND OF THE INVENTION

One embodiment of the present invention relates to a memory device with a gated fuse element. More specifically, one embodiment of the present invention relates to verifying the state of a gated fuse element used with a one-time programmable CMOS memory device.

There are two main types of memory devices used in the field of data storage. The first type is volatile memory that has the information stored in a particular memory device, where the information is lost the instant power is removed. The second type is a non-volatile memory device in which the information is preserved even with the power removed. Of the second type, some designs provide for multiple programming while other designs provide for one-time programming. Typically, the manufacturing techniques used to form such non-volatile memories are quite different from standard logic processes, thereby dramatically increasing the complexity and chip size of such memories.

One-time programmable (alternatively referred to as "OTP") memory devices have numerous applications, specifically long-term applications. For example, OTP memory devices may be used in post package programming to store security codes, keys or identifiers. These codes, keys or identifiers cannot be electrically altered or decoded without destroying the circuitry. Further, such OTP memory devices may be used to make a device unique for a specific application. Alternatively, such memory devices may be used as memory elements in programmable logic and read only memory devices.

Known OTP memory devices use storage elements combined with poly fuses. One disadvantage of poly fuses is that the resistance ratio is fairly close together, having only about one order of magnitude difference in value. In other words, the resistance of poly fuses before they are blown and the resistance after they are blown is fairly close. Therefore, sensing the difference between a blown and un-blown poly fuse is difficult. Yet another disadvantage of conventional poly fuses is the instability of their programmed state resistance. Specifically, the resistance of the programmed poly fuses tends to decrease over time. In the worst case, the programmed poly fuse may actually switch from the programmed state to the unprogrammed state resulting in circuit failure.

Thick oxide gated transistors or fuses (i.e., fuses fabricated according to 0.35 μm, 0.28 μm or other thick process technologies) have been used in place of poly fuse memory devices. U.S. Pat. No. 6,044,012 discloses a technique for rupturing the gate oxide transistor, where the oxide is about 40 to 70 Å thick. It is contemplated that the voltage required to rupture this thick oxide is substantially high and requires using a charge pump circuit. Furthermore, it is believed that the final programmed resistance is in the high kilo ohms range.

One alternative is to use an OTP CMOS memory device having thin-gated oxide transistors or fuses. Commonly assigned application Ser. No. 09/739,752, the complete subject matter of which is incorporated herein by reference, discloses the physical current used to rupture, breakdown or blow a gate-ox fuse, where the oxide is about 2.5 nm thick or less (alternatively referred to as "thin oxide" or "thin gate-ox transistor or fuse"). These thin gate-ox transistors or fuses integrate both NMOS and PMOS transistors on a silicon substrate. The NMOS transistor consists of a N-type doped polysilicon gate, a channel conduction region, and source/drain regions formed by diffusion of N-type dopant in the silicon substrate. The channel region separates the source from the drain in the lateral direction, whereas a layer of dielectric material that prevents electrical current flow separates the polysilicon gate from the channel. Similarly, the PMOS transistor architecture is the same as the NMOS transistor provided previously but using a P-type dopant.

The dielectric material separating the polysilicon gate from the channel region usually consists of thermally grown oxide material, silicon dioxide ($SiO_2$) for example, where the oxide is about 2.5 nm thick or less. Here the thin oxide leaks very little current, through a mechanism called Fowler-Nordheim tunneling, under voltage stress. When this thin gate-ox transistor or fuse is stressed beyond a critical electrical field (applied voltage divided by the thickness of the oxide) the oxide ruptures, destroying (alternatively referred to as "blowing") the transistor or fuse. If the fuse is connected or coupled to a storage element as part of a memory cell as disclosed in commonly assigned application Ser. No. 10/025,132 now U.S. Pat. No. 6,525,955, titled "Memory Cell with Fuse Element", the complete subject matter of which is incorporated herein by reference, blowing the transistor or fuse sets the state or programs the storage element and thus the memory cell.

Setting the state or programming the memory device effectively changes the parameters thereof. More specifically, setting the state of the transistor or fuse is a destructive act, as the blown fuse is effectively destroyed. After programming a memory device, it is advantageous to verify such programming. In other words, once the state of the fuse is set, it is advantageous to verify that such set state is correct and will not vary over the life time of the memory cell.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

Features of the present invention may be found in a one-time programmable CMOS memory device and method of verifying the programmed state of a gate-ox fuse used in a one-time programmable CMOS memory device. In one embodiment, the memory cell or device comprises comparing the resistance of a programmed fuse to a reference level, which is determined from experimental measurements from reference fuses.

One embodiment of the present invention relates to a method of verifying a state of an element having at least two states. The method comprises determining if the state of the element is equal to an expected state using a verify circuit and outputting a valid signal if the state of the element is equal to the expected state.

Yet another embodiment relates to a method for verifying a state of a memory device. The method comprises comparing a state of a first gated fuse to a first expected state and generating a first signal. A state of a second gated fuse is compared to a second expected state and a second signal is generated. A valid signal is output if both the first and second signals are the same.

One embodiment of the present invention relates to a method for verifying the state of a gated fuse element used with a one-time programmable CMOS memory device. A first expected state is set and a state of a first gate-ox fuse is sensed. The state of the first gate-ox fuse is compared to the first expected state to determine if they are equal, and a first signal is generated. A second expected state is set and a state of a second gate-ox fuse is sensed. The state of the second gate-ox fuse is compared to the second expected state to determine if they are equal, and a second signal is generated. A valid output is generated if both the first and second signals are in a correct state, both signals are high for example.

In another embodiment, the present invention relates to a verify device. In this embodiment, the verifying device comprising at least one current amplifier qualified by a data input.

In yet another embodiment, the present invention relates to a memory device. The memory device comprises at least one memory cell having at least one gated fuse and at least one reference cell. At least one verify circuit connected to both the memory and reference cells is adapted to sense a state of the gated fuse. At least one exclusive nor gate is connected to the verify circuit, and a logic "and" gate is connected to the exclusive "nor" gate and adapted to generate a valid signal.

Other aspects, advantages, and novel features of the present invention, as well as details of an illustrated embodiment thereof, will be more fully understood from the following description and drawings, wherein like numerals refer to like parts.

DETAILED DESCRIPTION OF THE INVENTION

Setting the state of a transistor or fuse is a destructive act. After programming the fuse, it is advantageous to verify the state of the fuse. It is important to be able to read back the programmed fuse with some margin to verify that once the memory device is produced and used in the field, it is always going to return to the programmed state upon power up.

One embodiment of the present invention relates to a device and method adapted to conduct a stringent read of the programmed gate oxide fuse memory cells to verify the programmed state of the fuses. It is contemplated the memory device may include only one fuse memory cell, or two or more memory cells forming an array. Furthermore, it is contemplated that the memory cell and the verify circuit are part of one unit or device (i.e., the "memory device") or are separate devices that may be contained on one or more integrated circuit (i.e., "IC") chips. Furthermore, it is contemplated that, while the verify circuit of the present invention is discussed with respect to a thin oxide gated OTP memory cell, the verify device may be used with any device that has a signal that may be compared with a reference signal (i.e., a differential compare).

Figure 1:
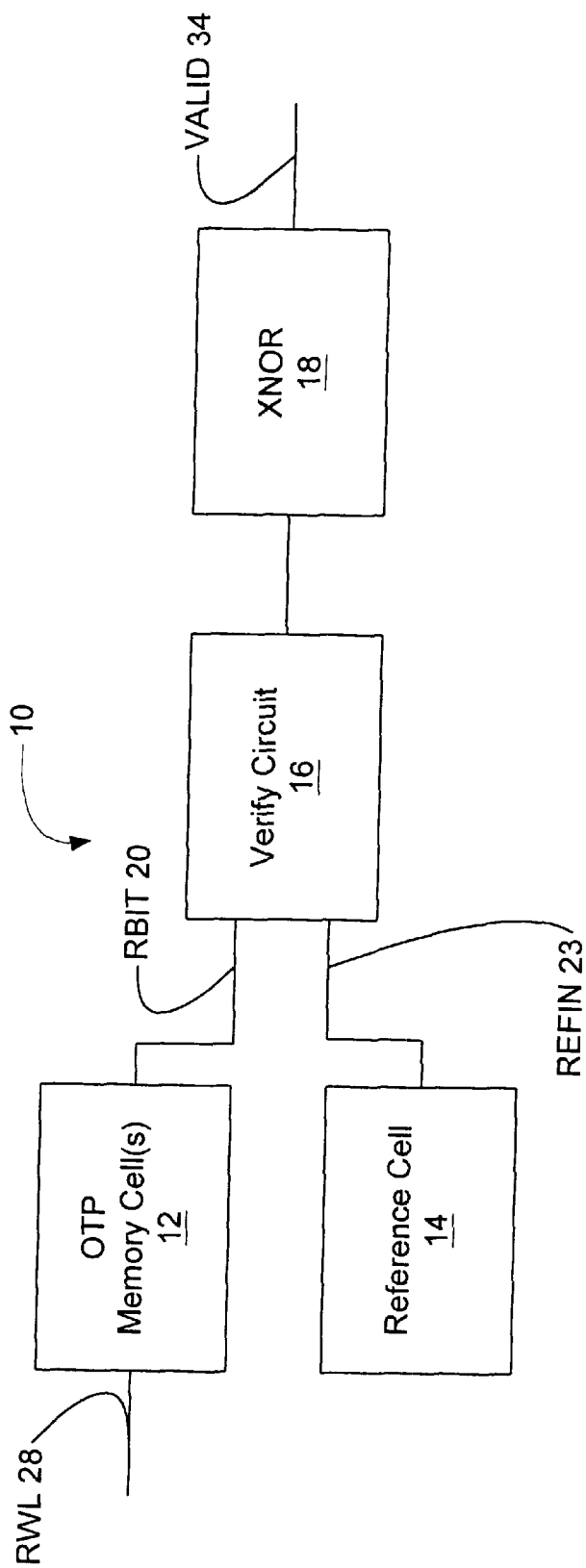
FIG. 1 illustrates a block diagram of a memory device including gated fuses and a verify circuit block used to verify the state of the gated fuses in accordance with one embodiment of the present invention.

One embodiment of the present invention comprises a verify circuit block connected to a gate oxide fuse array, and a compare data input through a column selected multiplexer. The verify circuit block conducts a read of the gate oxide fuse array, where such read is more stringent than expected field use. More specifically, FIG. 1 illustrates a memory device in accordance with one embodiment of the present invention. The memory device, generally designated 10, includes one or more memory cell(s) 12 and a reference cell 14 connected to, coupled to or otherwise communicating with verification or verify circuit block 16. In this embodiment, the verify circuit is coupled to an exclusive nor (alternatively referred to as "XNOR") gate 18 which has an output.

FIG. 1 further illustrates the memory device 10 has one or more coupling or connections. As illustrated, each of the OTP memory cell(s) 12 are connected to the common read bit lines RBIT 20 and RBITB (not illustrated in FIG. 1) through NMOS pass transistors which are controlled by wordline RWL 28. While only one OTP cell 12 is illustrated, it is contemplated that memory device 10 may include two or more (i.e., a plurality) OPT memory cells. Furthermore, XNOR gate 18 is illustrated having a valid output 34.

Figure 2:
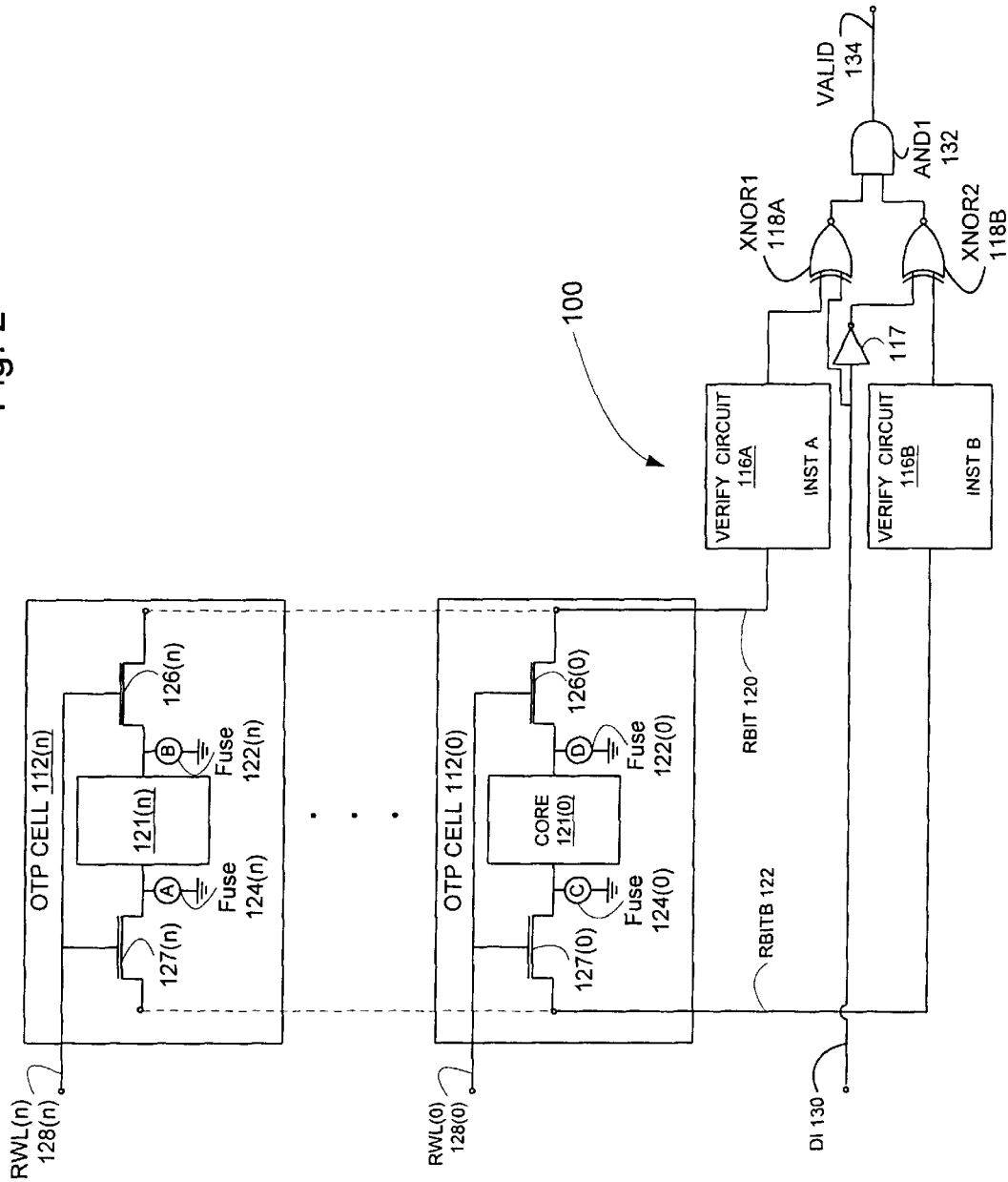
FIG. 2 illustrates a circuit diagram of a memory device similar to the memory device of FIG. 1 in accordance with one embodiment of the present invention.

FIG. 2 illustrates a circuit diagram of a memory device 100 similar to the memory device 10 of FIG. 1. As illustrated, each of the plurality of OTP memory cells 112(0) through 112(n) are comprised of a storage element or core 121(0) through 121(n) and two thin oxide gated fuse 122(0) through 122(n) and 124(0) through 124(n). Each of the OPT memory cells 112(0) through 112(n) are connected to the common read bit lines RBIT 120 and RBITB 122 through two NMOS pass transistors 126(0) though 126(n) and 127(0) through 127(n) respectively, each of which are controlled by the one or more word lines RWL 128(0) through 128(n) respectively.

In this embodiment, read bit line RBIT 120 is connected to the verify circuit INST A 116A, which senses the state of the fuse element D 122(0) when RWL(0) 128(0) is in a high state. This sensed state depends on the data input DI 130, which sets the first expected state of fuse element D 122(0). The output of the verify circuit INST A 116A and DI 130 is passed, communicated or transmitted to a first XNOR gate 118A, which generates a high state or signal if the sensed state of fuse element D 122(0) is equivalent to the state of the DI input.

As illustrated, read bit line RBITB 122 is connected to the verify circuit INST B 116B which senses the state of the fuse element C 124(0) when RWL(0) 128(0) is in a high state. Again the state sensed by the verify circuit 116B depends on the data input pin DI 130, which sets a second expected state. In one embodiment, the second expected state is the inverse of the first expected state. More specifically, the inverter 117 inverts DI 130 forming the second expected state.

The output of the verify circuit INSTB is passed to the second XNOR gate 118B with the second expected state. In one embodiment, XNOR2 118B generates a high state if the state of the fuse element C124(0) is equivalent to the second expected state (i.e., the inverse of the state of the DI input). Finally, the outputs of XNOR1 118A and XNOR2 118B are passed to the logic AND1 132 which generates an output VALID 134 if both of the fuse elements are in a correct state. In one embodiment, a valid signal is generated if both outputs of the XNOR1 118A and XNOR2 118B are in the same state, a high state for example.

Figure 3:
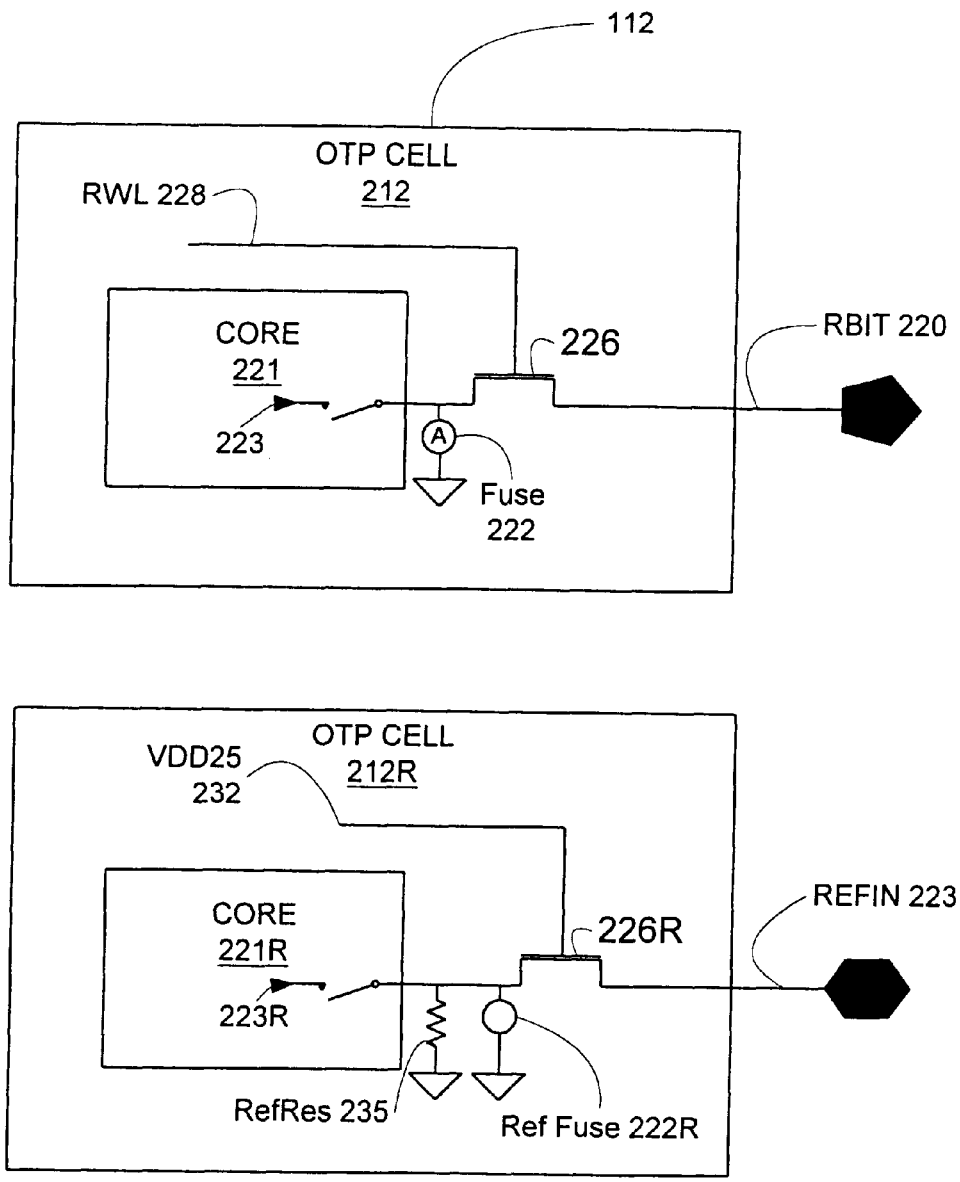
FIG. 3 illustrates a circuit diagram of two OTP memory cells similar to the memory cells of FIG. 2 in accordance with one embodiment of the present invention.
Figure 4:
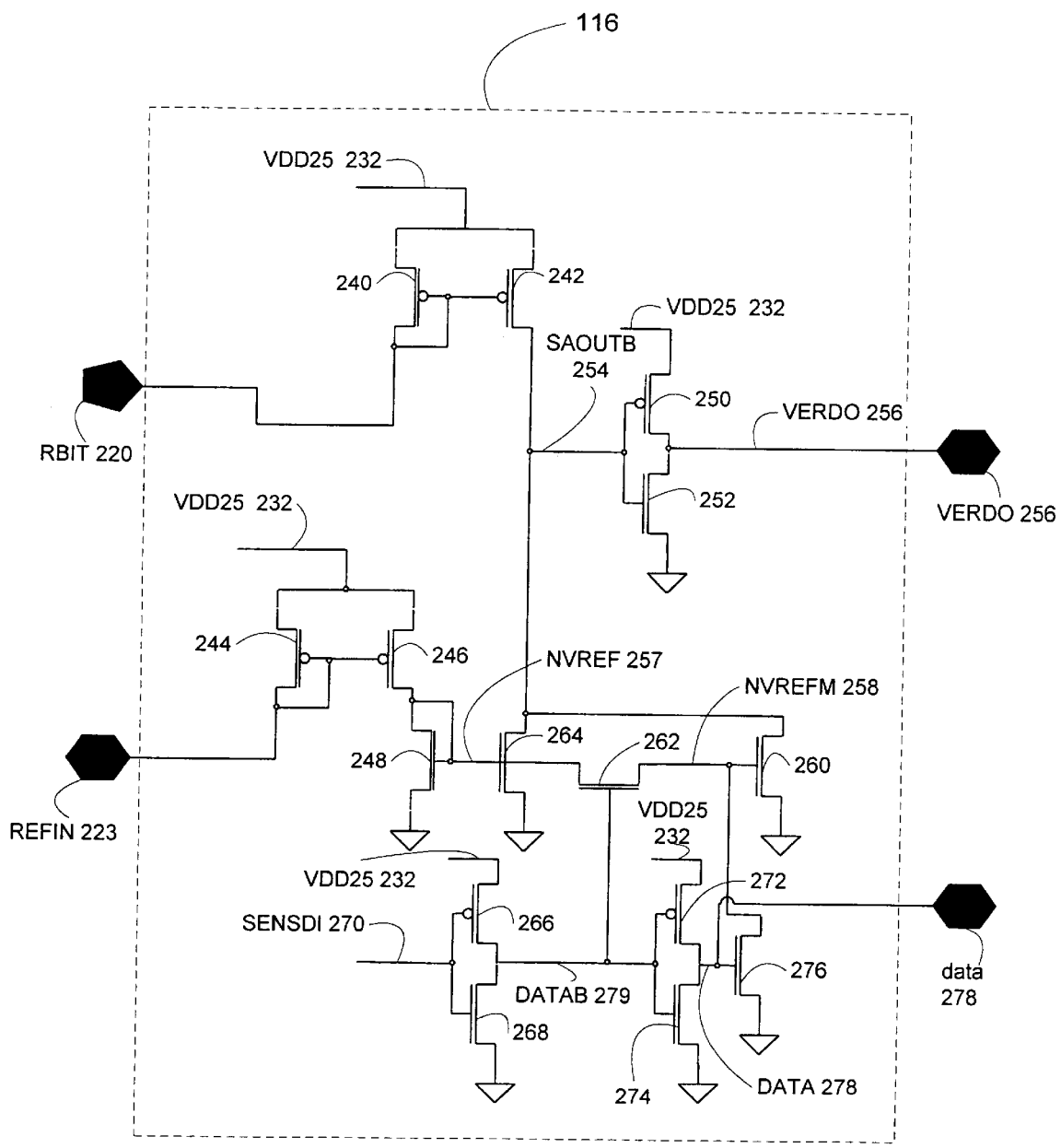
FIG. 4 illustrates a circuit diagram of a verify circuit block similar to the verify circuit block of FIG. 2 in accordance with one embodiment of the present invention.
Figure 5:
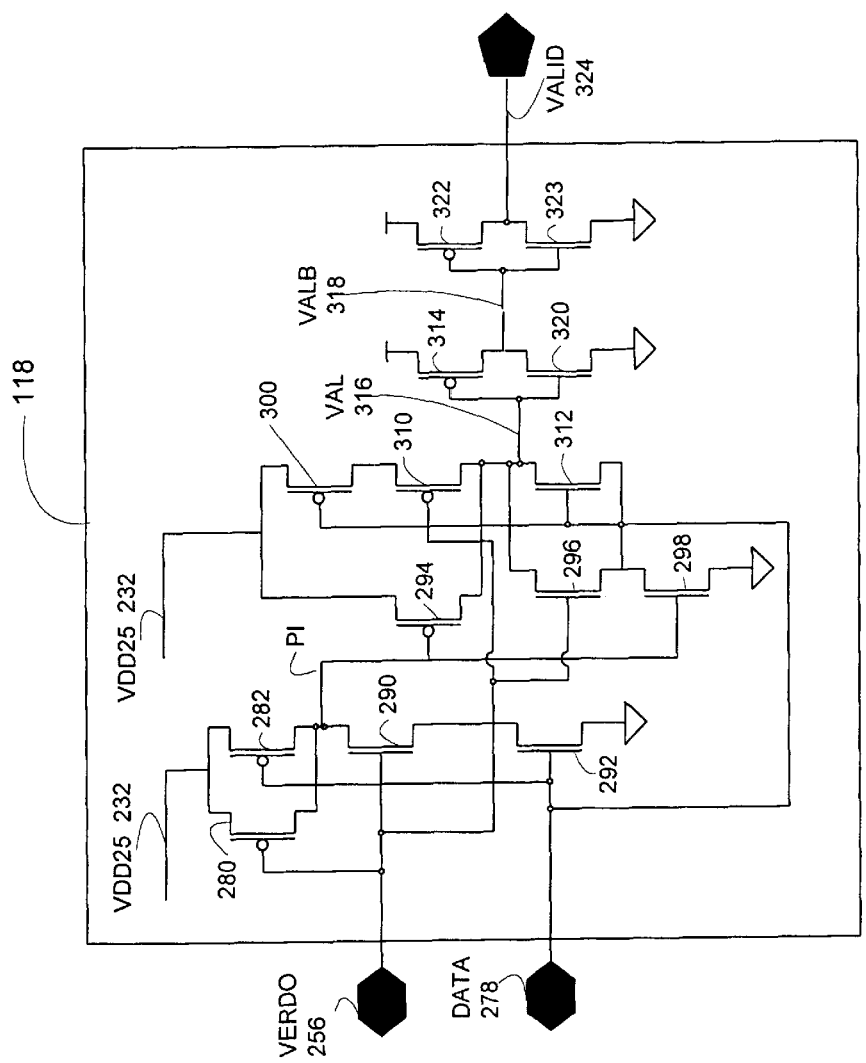
FIG. 5 illustrates a circuit diagram of an exclusive nor gate similar to the exclusive nor gate illustrated in FIG. 2 in accordance with one embodiment of the present invention.

FIGS. 3, 4 and 5 provide greater detail of the operation of the verify circuit block and its interaction with the OPT memory cell(s) and XNOR gates. FIG. 3 illustrates OTP memory cell 212 having storage element or core 221 with switch 223 connected to one or more thin oxide gated fuse element(s), fuse 222 for example. In one embodiment of the present invention, fuse 222 is isolated from the core 221 by switch 223. OTP memory cell or reference cell 221R is illustrated having storage element or core 221R with switch 223R connected to one or more thin oxide gated Ref Fuse 222R and RefRes 235. In one embodiment of the present invention, the Ref Fuse 222R is connected to the core 221 R in an isolated manner.

Fuse element A 222 is connected to RBIT 220 through NMOS transistor 226, which has its gate tied to the read word line RWL 228. As illustrated in FIG. 4, fuse element A 222 is connected to the gate and source of transistor 240 and the gate of transistor 242 through RBIT 220. The current in transistor 240, which is set by the current flow into fuse element A 222, is mirrored to transistor 242.

Ref Fuse 222R is connected to REFIN 223 through NMOS transistor 226R which has its gate tied to VDD25 232. As illustrated in FIG. 4, Ref Fuse 222R is connected to the gate and source of transistor 244 and the gate of transistor 246 through REFIN 223. Transistors 244 and 246 are matched to transistors 242 and 240 and provide the same function thereof by mirroring the reference current set by the RefRes 235 and the current in the open fuse element Ref Fuse 222R. In one embodiment reference cell 212R provides a reference current and sets the state of transistors 244 and 246, mimicking a blown fuse.

In one embodiment of the present invention, the programmed memory cells generally includes two gated fuse, a blown fuse and a non-blown or unblown fuse. The verify circuit verifies the states of the two fuses. In this embodiment, the verify circuit block 116 illustrated in FIG. 2 has two bias points based on a state of the SENSDI 270. For example, if SENSDI 270 is high (to determine if the fuse is in an unblown state) then DATAB 279 is low due to the inverter comprising transistors 266 and 268. DATA 278 is then high due to the inverter comprising transistors 272 and 274. This results in transistor 262 isolating NVREF 257 and NVREFM 258. In addition, NVREFM 258 is held low by transistor 276, which turns off transistor 260.

In this manner, transistors 248 and 264 form a mirror that transfers ⅛ of the reference current in transistor 246 to transistor 264. If for example the current in fuse element A 222 is greater than ⅛ of the reference current (set by RefRes 235 and Ref Fuse 222R), this causes SAOUTB 254 to move above the switch point voltage of the inverter formed by transistors 250 and 252. This causes VERDO 256 to transition to a low state. If however the current in fuse element A 222 is less than or equal to ⅛ of the reference current for example, SAOUTB 254 will remain below the switch point voltage of the inverter formed by transistors 250 and 252, causing VERDO 256 to remain in the high state. In one embodiment, the present invention includes a current mirroring amplifier comprising transistors 240, 242, 244, 246, 248, 264, 260 and 262 which may be programmed using programming data.

If however SENSDI 270 is low for example (to determine if the fuse is blown), then DATAB 279 is high due to the inverter comprising transistors 266 and 268. DATA 278 is then low due to the inverter comprising transistors 272 and 274. This results in transistor 262 providing a short between NVREF 257 and NVREFM 258. In this manner, transistors 248, 264 and 260 form a mirror that transfers ⅛ of the reference current in transistor 246 to transistor 264 and ⅞ of the reference current in transistor 246 to transistor 260. At this point, the current in Fuse A 222 must be greater than the reference current (set by RefRes 235 and Ref Fuse 222R) to cause SAOUTB 254 to move above the switch point voltage of the inverter formed by transistors 250 and 252. This causes VERDO 256 to transition to a low state. If the current in fuse element A 222 is less than or equal to the reference current, SAOUTB 254 remains below the switch point voltage of the inverter formed by transistor 250 and 252, causing VERDO 256 to remain in the high state.

The remaining transistors illustrated in FIG. 5 (transistors 280, 282, 290, 292, 298, 296, 312, 294, 310, 300, 320, 314, 322, and 323) are connected or coupled together forming one embodiment of an XNOR gate as provided previously. The inputs to the XNOR gate are VERDO 256 and DATA 278 and the output is VALID 324. VALID 324 remains in a low state unless both VERDO and DATA are both in a correct state. For example, VALID is in a high state if both VERDO and DATA are in a high state.

Figure 6:
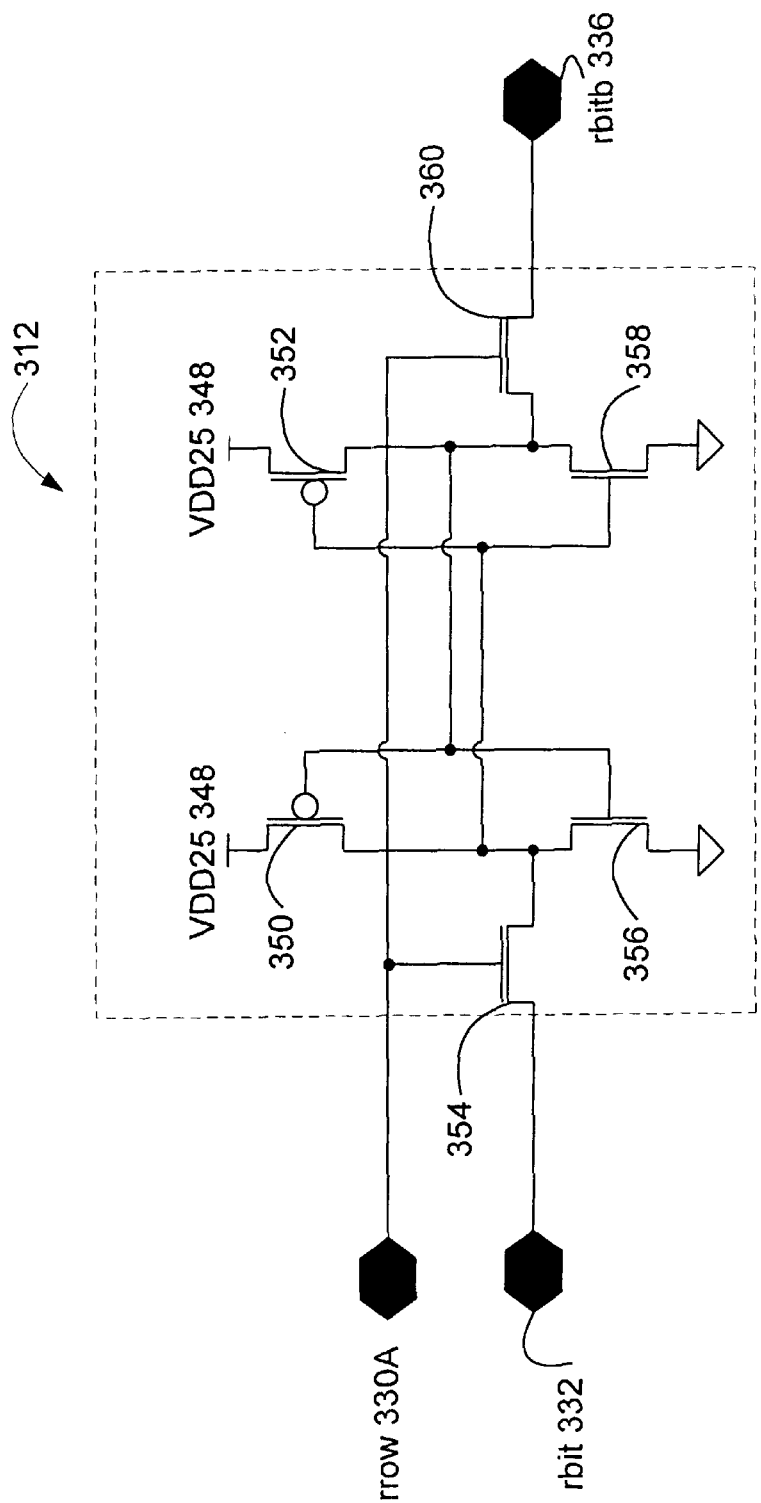
FIG. 6 illustrates one embodiment of a 6T storage element similar to the storage element included in the memory cell illustrated in FIG. 2 in accordance with one embodiment of the present invention.

Referring to FIG. 6, one embodiment of a core generally designated 312 (similar to the storage elements 12 and 212 provided previously) is illustrated. In one example, the core 312 is a 6T CMOS SRAM storage element comprising two PFet transistors 350 and 352 and four NFet transistors 354, 356, 358 and 360. A PFet transistor is turned on by a logic 0 at its gate and is adapted to pass or transmit a logic 1. An NFet transistor is turned on by a logic 1 at its gate and is adapted to pass or transmit a logic 0. The core may, in one embodiment of the present invention, be arranged in a plurality of rows and columns.

The storage element 312 is either in a low or high stored memory state. If a logic 0 is stored (i.e., storage element 312 is in a low stored state) recording new and opposite information stores a logic 1 on the storage element (i.e., a high stored state). If logic 1 is recorded on storage element 312 (i.e., storage element 312 is in a high stored state) recording new and opposite information records logic 0 (i.e., changes the storage element to a low stored state).

Figure 7:
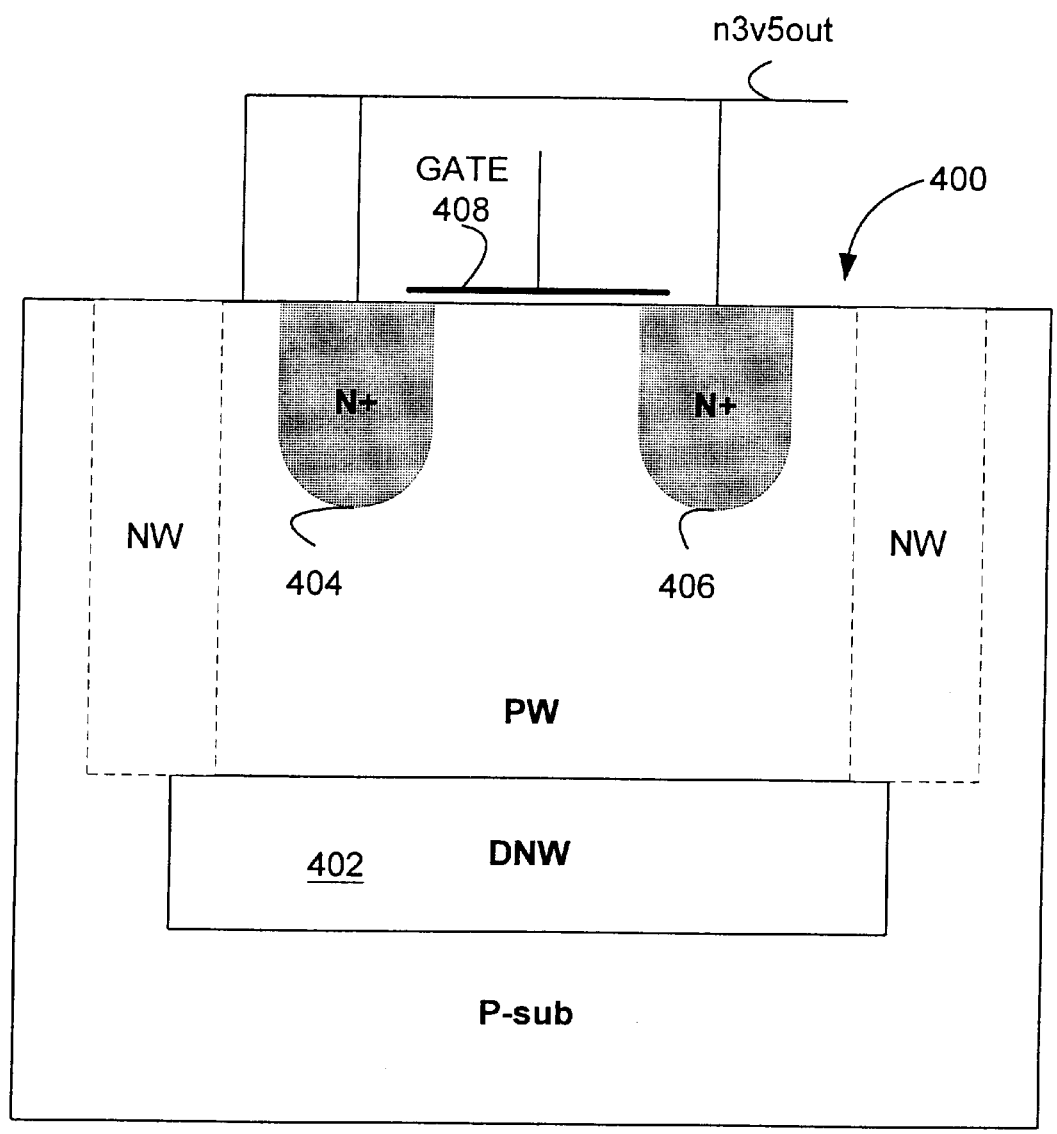
FIG. 7 illustrates one embodiment of a deep N-well MOSFET gate-ox fuse similar to the gate-ox fuses illustrated in FIG. 2.

FIG. 7 illustrates one embodiment of a fuse element 400 (similar to the fuses 122, 124 and 222 provided previously). In this embodiment fuse element 400 is a deep N-well MOSFET gate-ox fuse 400 having an oxide about 2.5 nm thick or less used with a storage element according to one embodiment of the present invention. The fuse 400 includes a deep N-well 402. N3v5out is illustrated coupling source 404 and drain 406. The gate 408 is coupled to vload (not shown). This low voltage CMOS gate-ox fuse transistor is programmed by controlled pulses of electrical current having predetermined amplitude to rupture its gate oxide. The electrical power through the gate oxide cannot exceed a certain voltage and duration so as to avoid creating a void in the gate oxide.

The advantage of the deep N-well 402 is that it isolates the memory cell, allowing biasing the well, source and drain to −3.5 volts. During a write operation 2.5 volts is applied to the gate through the vload, thus effectively creating less than about a 6 volt voltage difference across the gate 408 oxide to rupture it. For example, in one embodiment about a 5 volt voltage difference is created across the gate oxide rupturing it.

When the gate oxide is blown, a conductive path is formed between the gate electrode and the source/drain regions of the gate-ox fuse transistor. This resistance, under controlled electrical pulses, will be in the hundreds of ohms range or less, which is 4 orders of magnitude lower than the resistance prior to programming. To apply the high programming voltage across the gate oxide of the gate-ox fuse transistor, the drain and source regions of the transistor are connected to ground, and a programming voltage is applied to the gate of the fuse transistor as provided previously.

Figure 8:
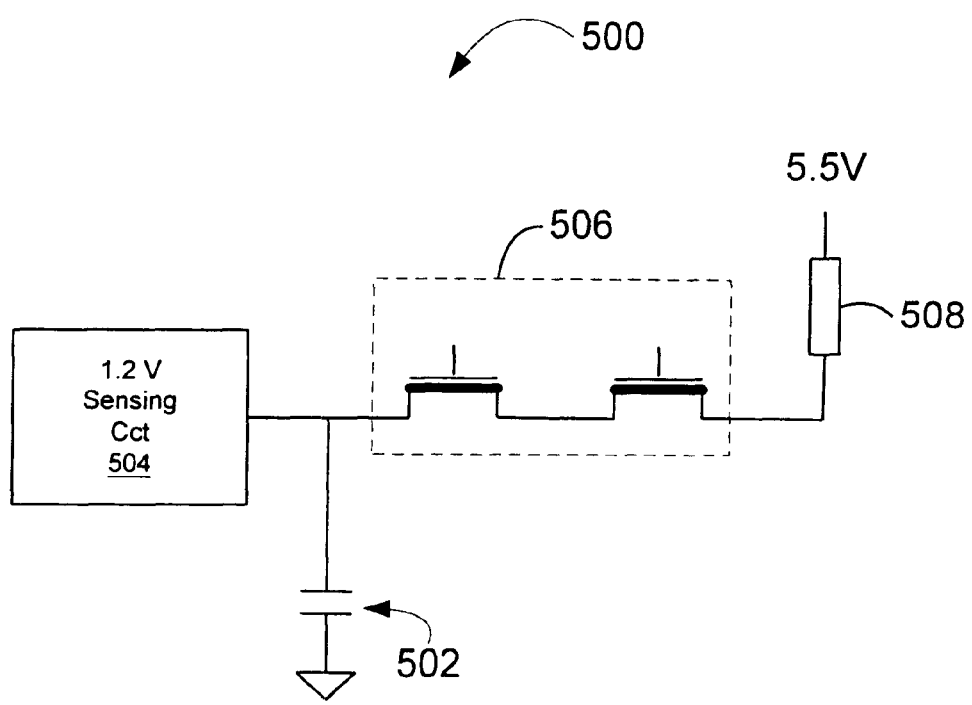
FIG. 8 illustrates another embodiment of a gate-ox fuse similar to the gate-ox fuse illustrated in FIG. 7.

FIG. 8 illustrates another embodiment of fuse element 500 similar to fuse elements 122, 124 and 222. In this embodiment the gate ox-fuse has an oxide about 2.5 nm thick or less in which a deep N-well transistor is not used. The transistor's gate (shown as capacitor 502) is tied to a 1.2 volt sensing circuit 504 and a 5 volt tolerant switch 506. The 5 volt tolerant switch 506 is constructed from Input/Output MOS devices having a thicker gate oxide.

Figure 9:
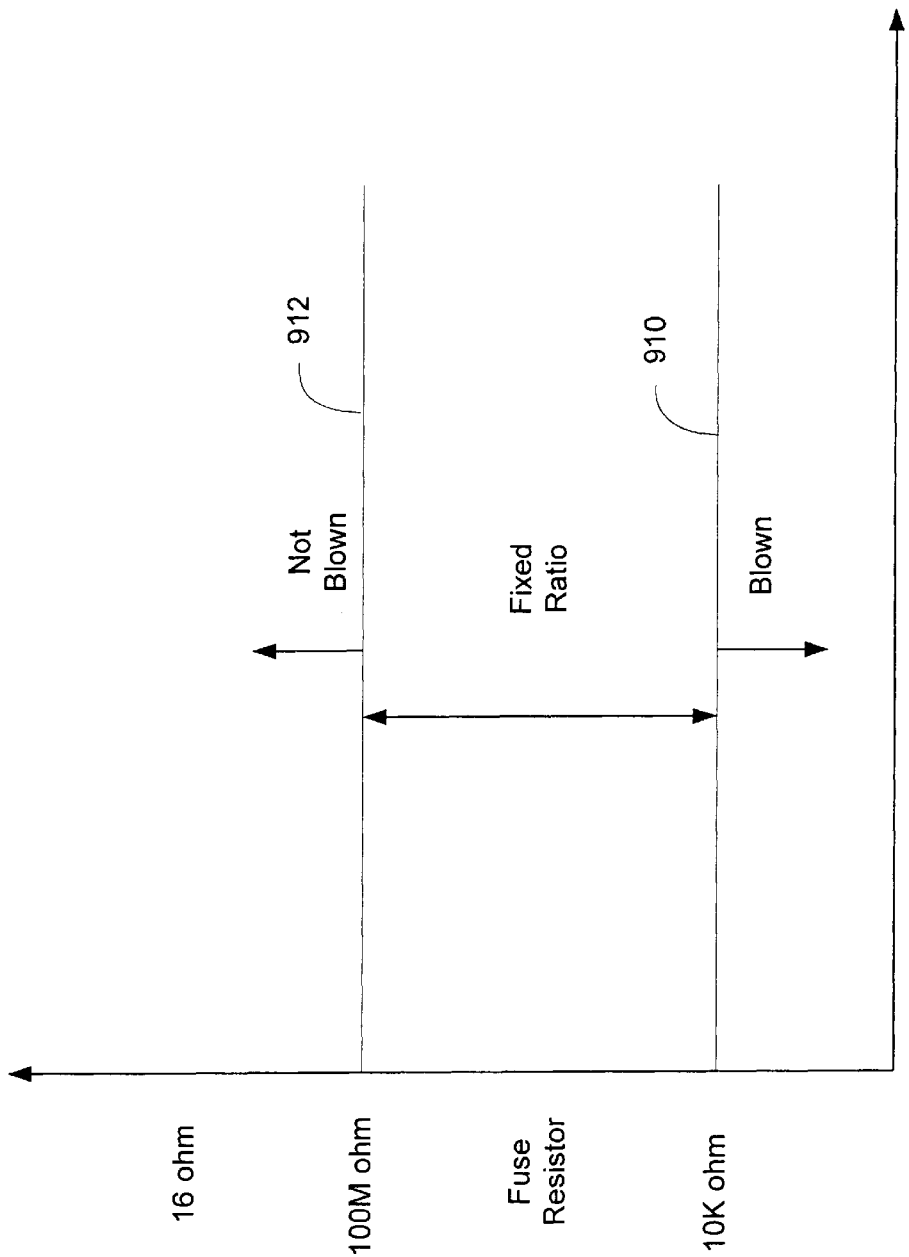
FIG. 9 illustrates a verify resistance window for a verify circuit block in accordance with one embodiment of the present invention.

FIG. 9 illustrates a window for a verify circuit used in accordance with one embodiment of the present invention. The verify window illustrates one example of a the fixed ratio between the blown and non-blown or unblown states of the fuse. In this embodiment, line 910 illustrates a point at which the fuse is considered blown, 100 Koms, for example. Line 912 illustrates the point at which the fuse is considered not blown or unblown, 100 M ohms for example. Anything between the blown and not blown state is designated the fixed ratio or verify window for verifying the state of a fuse. Generally if one of the lines, 910 for example, moves due to any change in the process, temperature or voltage, the other line will move about the same amount as it is similarly effected by such change. Thus the ratio between lines 910 and 912 remains about constant. This provides a generally fixed-margin for verifying the state of the fuse.

Figure 10:
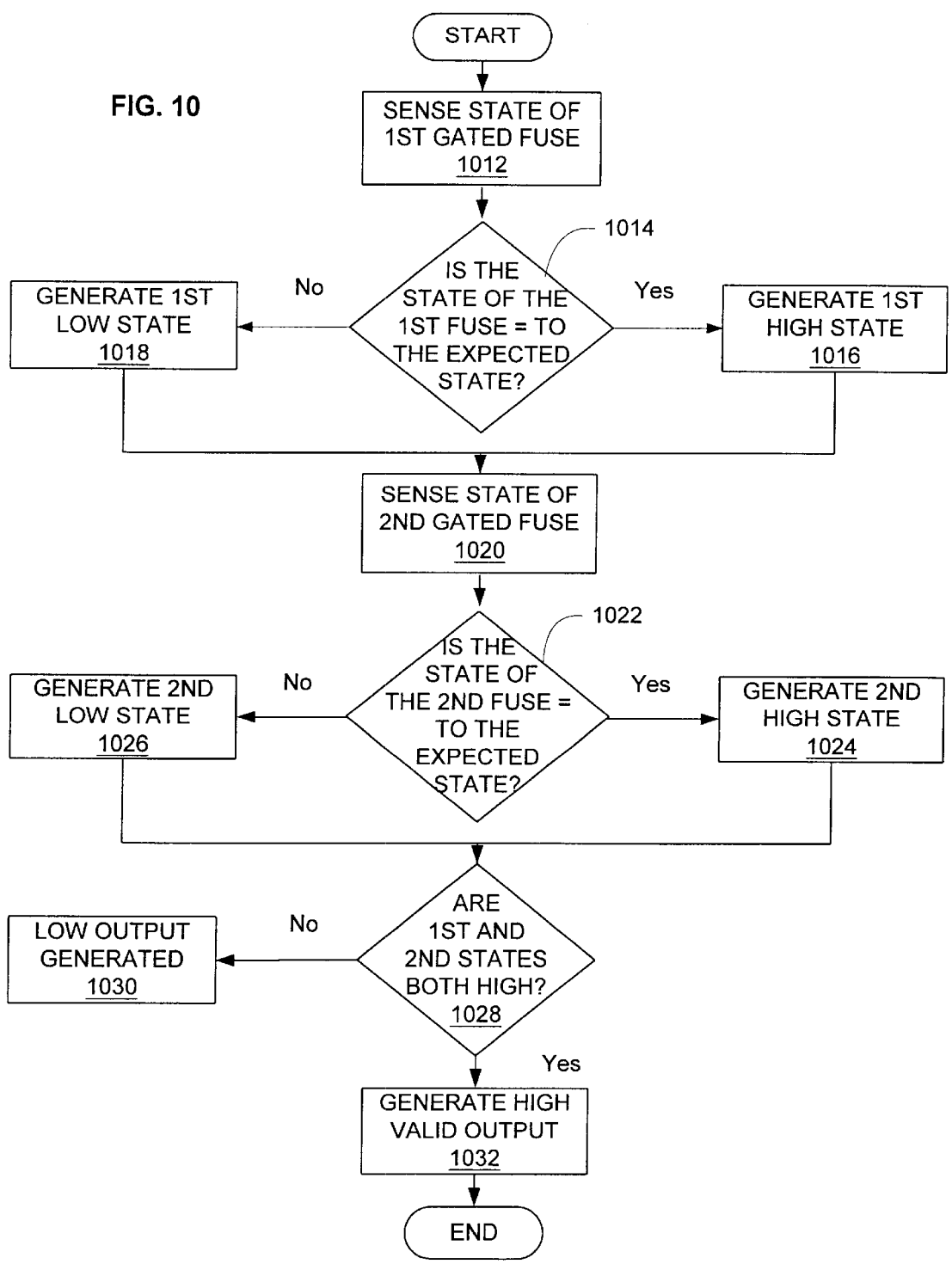
FIG. 10 illustrates a high level flow diagram for verifying the programmed state of the gated fuses in accordance with one embodiment of the present invention.

One embodiment of the present invention comprises verifying the state of the thin gate-ox fuses used to set a one-time programmable memory cell. FIG. 10 illustrates a high level flow chart illustrating one method for verifying the state of a gated fuse guaranteed over process, temperature and voltage change in accordance with one embodiment of the present invention. The method includes sensing the state of first gated fuse as illustrated by block 1012. The method further includes comparing the state of the first fuse to an expected state, determining whether the state of the first fuse is equal to the expected state as illustrated by diamond 1014. If the state of the first fuse is not equal to the expected state, a first low state or signal is generated as illustrated by block 1018. However, if the state of the first fuse is equal to the expected state, a first high state or signal is generated as illustrated by block 1016.

The state of the second fuse is then sensed as illustrated by block 1020. The method further includes comparing the state of the second fuse to an expected state, determining if the state of the second fuse is equal to the expected state as illustrated by diamond 1022. If the state of the second fuse is not equal to the expected state, a second high state or signal is generated as illustrated by block 1026. If, however, the state of the second fuse is equal to the expected state, a second high state or signal is generated as illustrated by block 1024.

The method determines whether first and second states are in the correct state, both high for example, as illustrated by diamond 1028. If either the first or second state is low, or both states are low, a low VALID output is generated as illustrated by block 1030. If however both the first and second states are high, a high VALID output is generated as illustrated by block 1032.

Figure 11A:
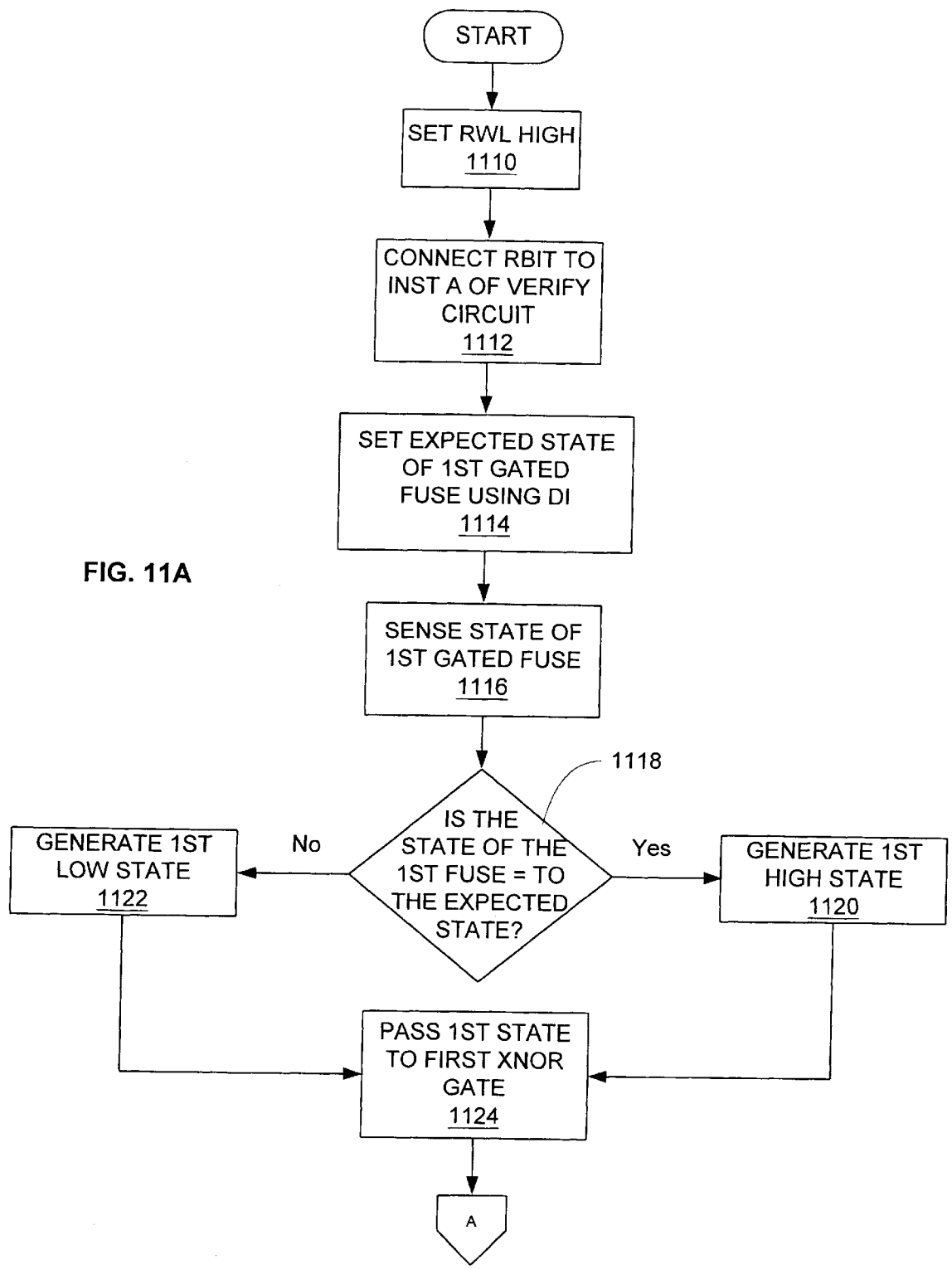
FIGS. 11A, 11B and 11C illustrate a detailed flow diagram for verifying the programmed state of the gated fuses in accordance with one embodiment of the present invention.
Figure 11B:
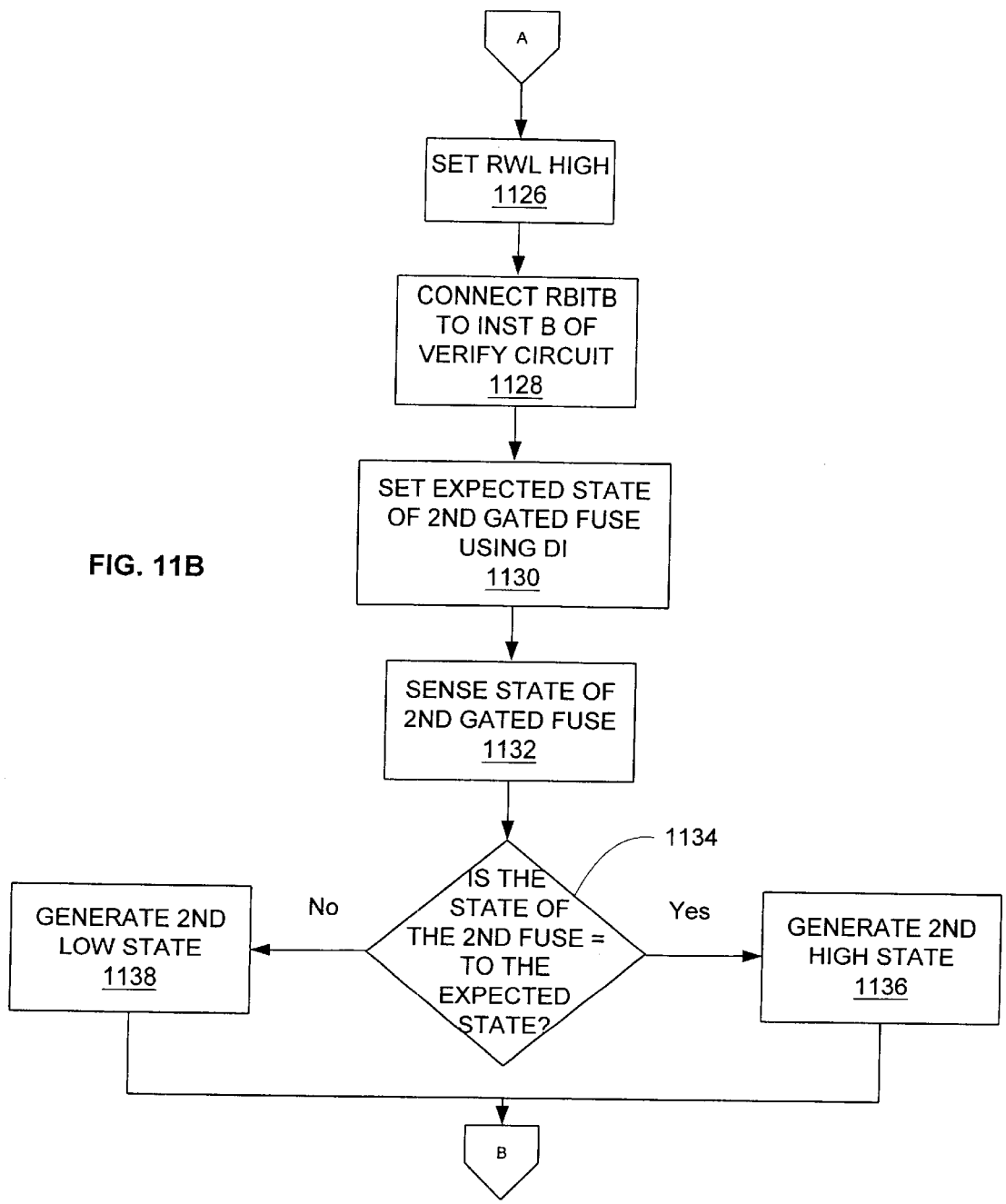
Figure 11C:
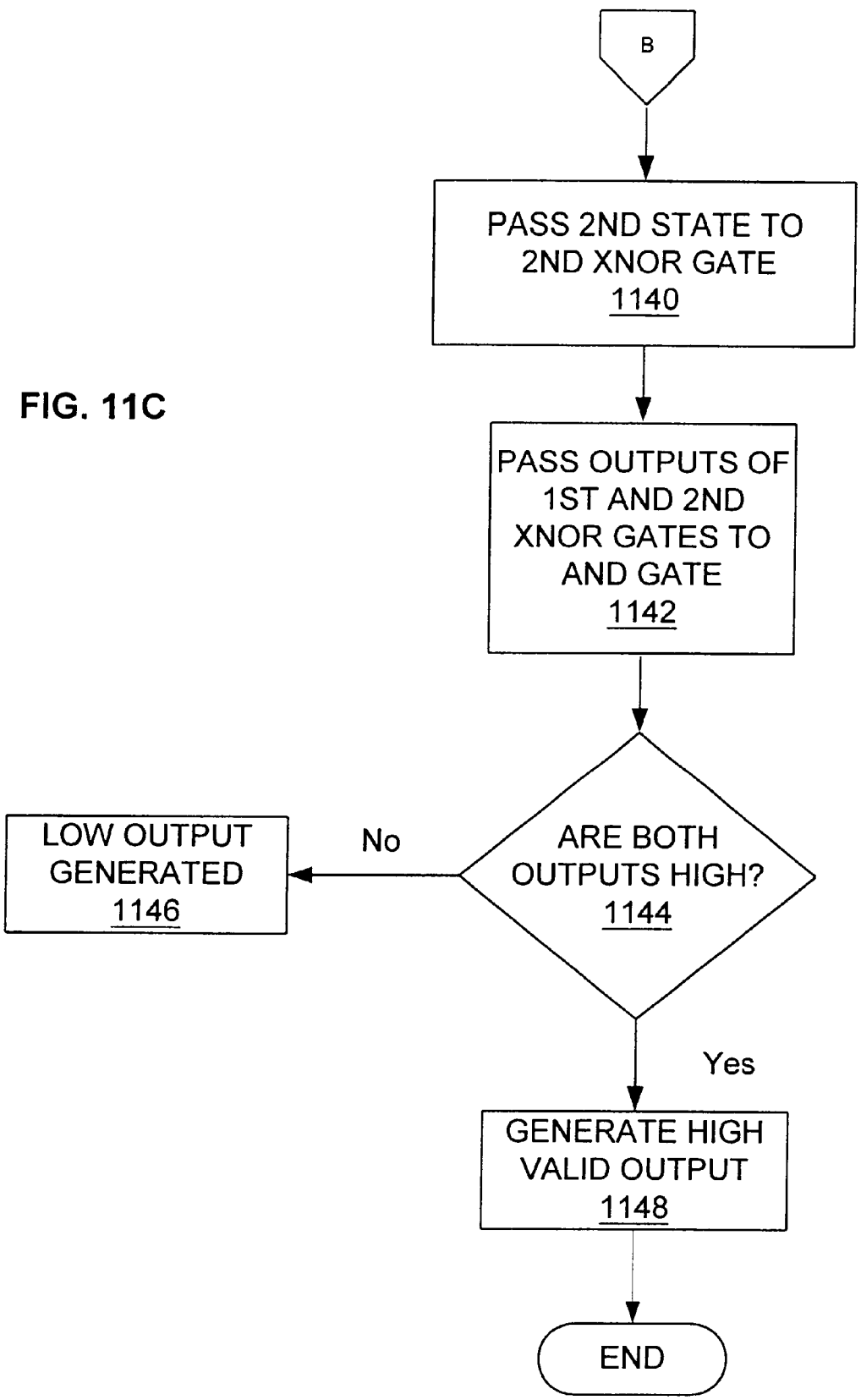

FIGS. 11A, 11B, 11C illustrate a detailed flow chart verifying the state of gated fuses used with the OTP memory cell in a memory device. RWL is set high as illustrated by block 1110. RBIT is connected to INSTA of the verify circuit as illustrated by block 1112. The expected state of the first gated fuse is set. In one embodiment of the present invention, the expected state of the first gated fuse is set using DI as illustrated by block 1114.

The state of the first gated fuse is sensed, as illustrated by block 1116. In one embodiment of the present invention, the state of the first gate fuse is sensed using mirrored current. The verify circuit determines whether the state of the first fuse is equal to the expected state as illustrated by diamond 1118. If the state of the first fuse is not equal to the expected state, a first low state is generated as illustrated by block 1122. If, however, the state of the first fuse is equally to the expected state, a first high state is generated as illustrated by 1120. This first state is then passed to a first XNOR gate as illustrated by block 1124.

RWL remains high, or in one embodiment, RWL is again set high as illustrated by block 1126. RbitB is connected to INSTB of the verify circuit as illustrated by block 1128. The expected state of the second gated fuse is set as illustrated by block 1130. In one embodiment of the present invention, the expected state is set using an inverter to invert the state of DI.

The state of the second gated fuse is sensed as illustrated by block 1132. In one embodiment of the present invention, the state of the second fuse is sensed using mirrored current. The verify circuit determines whether the state of the second fuse is equal to the expected state as illustrated by block 1134. If the state of the second fuse is not equal to the expected state, a second low state is generated as illustrated by block 1138. If, however, the state of the second fuse is equal to the expected state, a second high state is generated as illustrated by block 1136. The second state is then passed to a second XNOR gate as illustrated by block 1140.

The verify circuit then passes the outputs of the first and second XNOR gates to a logic AND gate as illustrated by block 1142 to determine if both the XNOR outputs are in the correct state. The logical AND gate determines whether both the outputs are high as illustrated by diamond 1144. If one or both outputs are low, a low VALID output is generated as illustrated by block 1146. If, however, both outputs are high, a high VALID output is generated as illustrated by block 1148.

Many modifications and variations of the present invention are possible in light of the above teachings. Thus, it is to be understood that, within the scope of the appended claims, the invention may be practiced otherwise than as described hereinabove.

The present invention may be implemented with various changes and substitutions to the illustrated embodiments. For example, the present invention may be implemented on substrates comprised of materials other than silicon, such as, for example, gallium, arsenide or sapphire.

What is claimed and desired to be secured by Letters Patent is:

1. A method for verifying a state of a memory device comprising:

comparing a state of a first gated fuse to a first expected state, and generating a first signal;

comparing a state of a second gated fuse to a second expected state, wherein said second expected state is an inverse of said first expected state, and generating a second signal; and outputting a valid signal if both said first and second signals are the same.

2. The method of claim 1, wherein said first and second gated fuses are thin oxide gated fuses.

3. The method of claim 2, wherein at least one of said first and second thin oxide gated fuses has an oxide that is less than 2.5 nm thick.

4. A method for verifying a state of a thin gate-ox fuse memory device, comprising:

setting a first expected state;

sensing a state of a first thin oxide gated fuse;

determining if said state of said first thin oxide gated fuse is equal to said first expected state and generating a first signal;

setting a second expected state;

sensing a state of a second thin oxide gated fuse;

determining if said state of said second thin oxide gated fuse is equal to said second expected state and generating a second signal, wherein said second expected state is an inverse of said first expected state; and generating a valid output if both said first and second signals are the same.

5. The method of claim 4, wherein at least one of said first and second thin oxide gated fuses has an oxide that is less than 2.5 nm thick.

* * * * *